United States Patent
Ozu

(10) Patent No.: US 8,835,320 B2
(45) Date of Patent: Sep. 16, 2014

(54) ETCHING METHOD AND DEVICE

(75) Inventor: Toshihisa Ozu, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/807,550

(22) PCT Filed: Apr. 19, 2011

(86) PCT No.: PCT/JP2011/059587
§ 371 (c)(1),
(2), (4) Date: Dec. 28, 2012

(87) PCT Pub. No.: WO2012/002027
PCT Pub. Date: Jan. 5, 2012

(65) Prior Publication Data
US 2013/0102157 A1 Apr. 25, 2013

(30) Foreign Application Priority Data
Jun. 29, 2010 (JP) ................. 2010-147357

(51) Int. Cl.
*H01L 21/311* (2006.01)
*H01L 21/8238* (2006.01)
*H01J 37/32* (2006.01)
*H01L 29/66* (2006.01)
*H01L 21/3065* (2006.01)
*H01L 29/78* (2006.01)
*H01L 21/768* (2006.01)

(52) U.S. Cl.
CPC .... *H01L 21/3065* (2013.01); *H01L 21/823864* (2013.01); *H01J 37/32192* (2013.01); *H01L 29/6656* (2013.01); *H01L 21/31116* (2013.01); *H01L 21/823807* (2013.01); *H01L 29/6659* (2013.01); *H01L 29/7843* (2013.01); *H01L 21/76834* (2013.01); *H01J 2237/334* (2013.01)
USPC ............... 438/695; 438/706; 216/37; 216/79

(58) Field of Classification Search
CPC ..................... H01L 21/0337; H01L 21/31116; H01L 21/31138; H01L 21/31056; H01L 21/31055; H01L 21/30655; H01L 21/32137
USPC .......... 216/67, 46, 37, 79; 438/706, 723, 734, 438/743
See application file for complete search history.

(56) References Cited

U.S. PATENT DOCUMENTS

| | | | |
|---|---|---|---|
| 6,357,385 B1 * | 3/2002 | Ohmi et al. | 118/723 AN |
| 6,500,745 B1 | 12/2002 | Ikegami | |
| 6,916,746 B1 * | 7/2005 | Hudson et al. | 438/706 |
| 7,528,029 B2 | 5/2009 | Grudowski et al. | |
| 7,790,047 B2 * | 9/2010 | Huang et al. | 216/41 |

(Continued)

FOREIGN PATENT DOCUMENTS

| | | |
|---|---|---|
| CN | 101174594 A | 5/2008 |
| JP | 9-92640 A | 4/1997 |

(Continued)

OTHER PUBLICATIONS

International Search Report mailed Jul. 5, 2011 in PCT/JP2011/059587 filed Apr. 19, 2011.

*Primary Examiner* — Roberts Culbert
(74) *Attorney, Agent, or Firm* — Rothwell, Figg, Ernst & Manbeck, P.C.

(57) ABSTRACT

An etching method can prevent adverse effects of oxygen plasma from arising under an insulating film when etching the insulating film formed on a substrate. The etching method includes: a first etching step for exposing the insulating film to processing gas that has been turned into a plasma to etch the insulating film to a portion in the thickness direction; a deposition material removing step for exposing the insulating film remaining after completion of the first etching to oxygen plasma to remove deposition material deposited on the surface of the remaining insulating film; and a second etching of exposing the remaining insulating film to processing gas that has been turned into a plasma to etch the remaining insulating film.

15 Claims, 17 Drawing Sheets

(56) References Cited

U.S. PATENT DOCUMENTS

| | | |
|---|---|---|
| 2005/0112879 A1 | 5/2005 | Fujimoto et al. |
| 2007/0045747 A1 | 3/2007 | Kohyama |

FOREIGN PATENT DOCUMENTS

| | | |
|---|---|---|
| JP | 2002-237603 A | 8/2002 |
| JP | 2004-87875 A | 3/2004 |
| JP | 2007-88452 A | 4/2007 |
| JP | 2007-266466 A | 10/2007 |
| JP | 2009-534849 A | 9/2009 |
| JP | 2010-109051 A | 5/2010 |
| TW | 200809957 A | 2/2008 |
| TW | 200903660 | 1/2009 |
| WO | 2008/150410 A1 | 12/2008 |

* cited by examiner

US 8,835,320 B2

ETCHING METHOD AND DEVICE

CROSS REFERENCE TO RELATED APPLICATION

This application is a 35 U.S.C. 371 National Phase Entry Application from PCT/JP2011/059587, filed Apr. 19, 2011, which claims the benefit of Japanese Patent Application No. 2010-147357 filed on Jun. 29, 2010, the disclosures of which are incorporated herein in its entirety by reference.

FIELD OF THE INVENTION

The present invention relates to an etching method and device for etching an insulating film formed on a substrate.

BACKGROUND OF THE INVENTION

In a semiconductor device manufacturing process, when an insulating film formed on a substrate is etched, an etching process of high selectivity is required to prevent a base film from being damaged. For example, when a silicon oxide film formed on a substrate is etched by a dual stress liner technique, high etching selectivity of the silicon oxide film to a silicon nitride film is required to prevent the silicon nitride film as a base from being damaged.

The dual stress liner technique is a technique for applying tensile stress to an N channel type FET (Field Effect Transistor) by covering the N channel type FET with a silicon nitride film and for applying compressive stress to a P channel type FET by covering the P channel type FET with a silicon nitride film (see, e.g., Japanese Patent Application Publication No. 2007-088452)). A drain current of a transistor is increased by applying stress to the transistor. Accordingly, performance of the transistor can be improved.

In the dual stress linear technique, the silicon nitride film to which the tensile stress is applied and the silicon nitride film to which the compressive stress is applied are separately formed. Therefore, (1) a silicon oxide film, (2) a silicon nitride film, and (3) a silicon oxide film are laminated on a substrate in that order. Then, a process of etching (3) the silicon oxide film and (2) the silicon oxide film is required. As for the etching, a dry etching of introducing a processing gas into an airtight processing chamber, turning the processing gas into a plasma, and exposing an insulating film to be etched to the processing gas that has been turned into the plasma is applied. As described above, when (3) the silicon oxide film is etched, it is required to increase selectivity of (3) silicon oxide film to (2) the silicon nitride film. In order to increase the selectivity of (3) the silicon oxide film to (2) the silicon nitride film, a CF-based or a CHF-based etching gas which performs film forming reaction and etching reaction simultaneously is used as the etching gas. Therefore, the etching is performed while balancing deposition of a CF-based deposit and etching.

However, in the case of using the CF-based or the CHF-based etching gas, a CF-based deposit remains on a surface of (2) the silicon nitride film upon completion of etching of (3) the silicon oxide film (completion of over etching). If the CF-based deposit remains, the deposit serves as an etching mask, and the etching of (2) the silicon nitride film as a base film does not occur locally.

To solve this problem, it is considered to use an ashing technique for removing the deposit by generating an oxygen plasma and reacting the oxygen plasma with the deposit upon completion of the over etching of the silicon oxide film.

However, when the oxygen plasma used in the ashing has a high energy, the surface of (2) the silicon nitride film is oxidized by the oxygen plasma, and a silicon oxide film is formed on the surface of (2) the silicon nitride film. If the silicon oxide film is formed, the etching of (2) the silicon nitride film in a next process is not carried out.

Further, in an etching process for forming an insulating film on a sidewall of a gate electrode, it is required to prevent a substrate from being damaged (recessed) by an oxygen plasma in order to manufacture a device in accordance with a design.

SUMMARY OF THE INVENTION

In view of the above, the present invention provides an etching method and device capable of preventing a base of an insulating film from being adversely affected by an oxygen plasma in the case etching the insulating film formed on a substrate.

In accordance with an aspect of the present invention, there is provided an etching method for etching an insulating film formed on a substrate. The method includes: first etching of exposing the insulating film to a processing gas that has been turned into a plasma and etching the insulating film to a position in a thickness direction; deposition material removing of exposing the insulating film remaining after completion of the first etching to an oxygen plasma and removing deposition material deposited on the surface of the remaining insulating film; and second etching of exposing the remaining insulating film to a processing gas that has been turned into a plasma and etching the remaining insulating film.

In accordance with another aspect of the present invention, there is provided an etching apparatus for etching an insulating film formed on a substrate. The insulating film is exposed to a processing gas that has been introduced into an airtight processing chamber and turned into a plasma, and is etched to a position in a thickness direction; the insulating film remaining after completion of the first etching is exposed to an oxygen plasma generated in the processing chamber by introducing an oxygen gas into the processing chamber, and a deposition material deposited on the surface of the remaining insulating film is removed; and the remaining insulating film is exposed to a processing gas that has been introduced into the processing chamber and turned into a plasma, and is etched.

Effect of the Invention

In accordance with the invention, a surface of a base is covered by a residual insulating film, so that the base can be prevented from being adversely affected by an oxygen plasma when a deposit on the insulating film is removed by the oxygen plasma.

Particularly when the silicon oxide film on the silicon nitride film is etched, the surface of the silicon nitride film as a base is covered by the residual silicon oxide film and, thus, the silicon nitride film can be prevented from being oxidized by the oxygen plasma. Further, since the CF-based deposit on the silicon oxide film is removed by the oxygen plasma, it is possible to avoid the phenomenon in which the etching of the silicon nitride film as a base does not occur locally due to the deposit serving as an etching mask.

DETAILED DESCRIPTION OF THE EMBODIMENTS

Figure 1A:
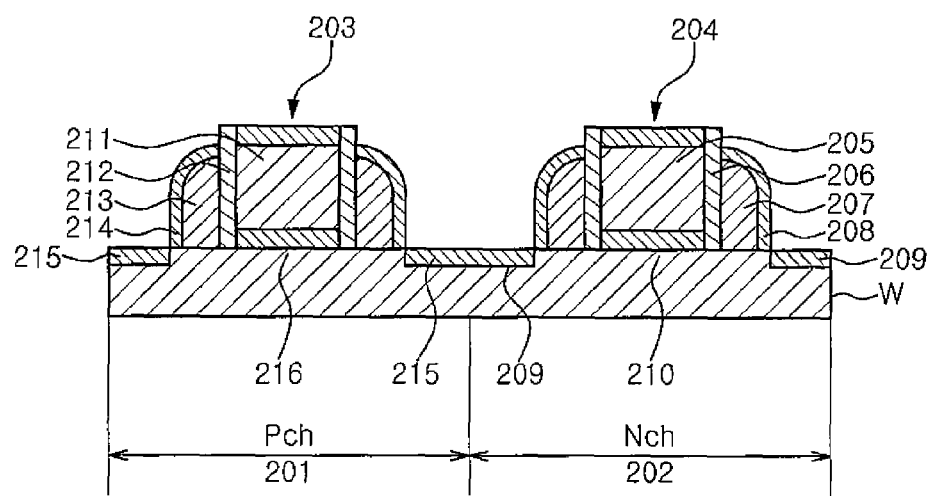
FIGS. 1A to 1F show processes of a CMOS transistor manufacturing method to which an etching method in accordance with a first embodiment of the present invention is applied.

Hereinafter, an etching method in accordance with a first embodiment of the present invention will be described with reference to accompanying drawings. Like reference numerals denote like components in the drawings.

FIGS. 1A to 1F show a semiconductor device manufacturing method, e.g., a CMOS (Complementary Metal Oxide Semiconductor) transistor manufacturing method, to which an etching method in accordance with a first embodiment of the present invention is applied.

As shown in FIG. 1A, a PMOS transistor 203 and an NMOS transistor 204 are formed on a substrate W made of silicon. The substrate W is divided into a PMOS region 201 and an NMOS region 202 by a device isolation region. The PMOS transistor 203 is provided at the PMOS region 201, and the NMOS transistor 204 is provided at the NMOS region 202. A gate electrode 205 made of polysilicon is formed at the NMOS region 202. A sidewall spacer 207 is formed on a sidewall of the gate electrode 205 via an offset spacer 206. A silicon oxide film 208 is formed on a surface of the sidewall spacer 207. Source/drain regions 209 are formed at both sides of the gate electrode 205. A channel 210 is provided between the source/drain regions 209.

A gate electrode 211 is formed at the PMOS region 201, and a sidewall spacer 213 is formed on a sidewall of the gate electrode 211 via an offset spacer 212. A silicon oxide film 214 is formed on a surface of the sidewall spacer 213. Source/drain regions 215 are formed at both sides of the gate electrode 211 on the silicon substrate W, and a channel 216 is provided between the source/drain regions 215. The PMOS transistor 203 and the NMOS transistor 204 are manufactured by a well-known technique such as film formation, etching, photolithography, ion implantation or the like. A silicide layer made of NiSi, CoSi, TiSi or the like is formed on the surfaces of the gate electrodes 205 and 211 and those of the source/drain regions 209 and 215.

The dual stress liner technique forms stress-inducing films for respectively applying tensile stress and compressive stress to the NMOS transistor 204 and the PMOS transistor 203 formed as described above and optimizes mobility of carriers. By applying stresses to the channels of the NMOS transistor 204 and the PMOS transistor 203, the drain current is increased. Accordingly, the performance of the transistor can be improved.

Figure 1B:
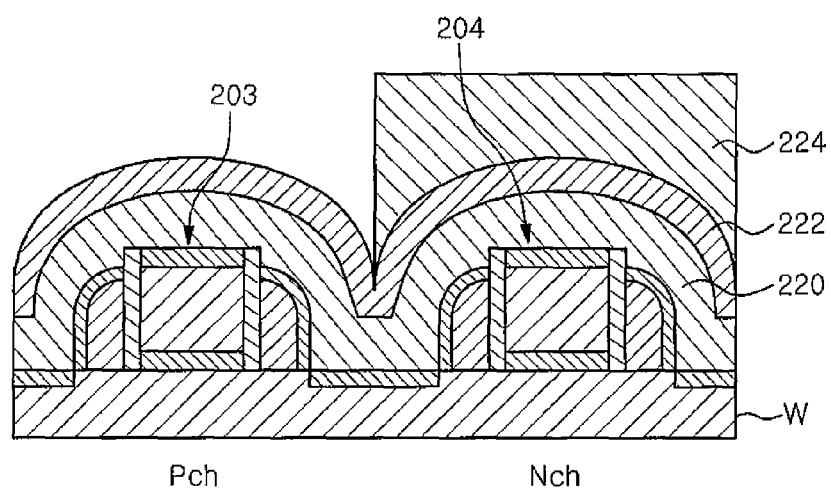

As shown in FIG. 1B, first, a silicon nitride (SiN) film 220 that covers the PMOS transistor 203 and the NMOS transistor 204 to apply a tensile stress is formed on the substrate W. The silicon nitride film 220 is formed by, e.g., CVD (Chemical Vapor Deposition). Then, a silicon oxide ($SiO_2$) film 222 serving as a hard mask is deposited on the silicon nitride (SiN) film 220. The silicon oxide film 222 is formed by, e.g., CVD. Next, a photoresist 224 is deposited on the silicon oxide film 222 of the NMOS transistor 204. The photoresist may be formed by a well-known photolithography technique.

Figure 1C:
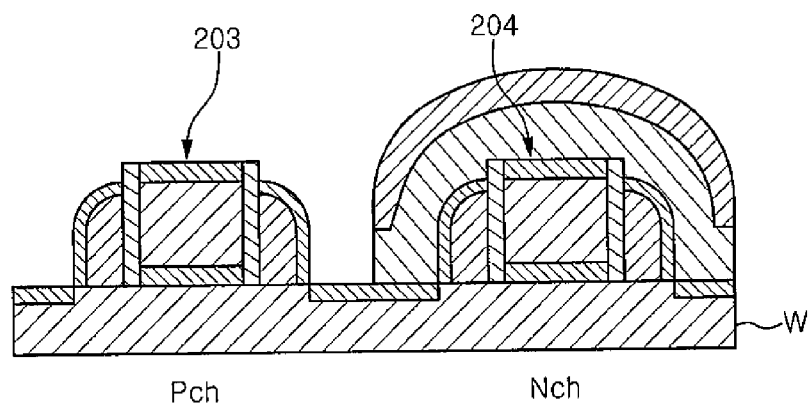

As shown in FIG. 1C, the silicon oxide film 222 and the silicon nitride film 220 on the PMOS transistor 203 are etched while using the photoresist 224 as a mask. The etching method in accordance with the first embodiment of the present invention is applied to the etching process from FIG. 1B to FIG. 1C. The etching method in accordance with the first embodiment of the present invention will be described later.

Figure 1D:
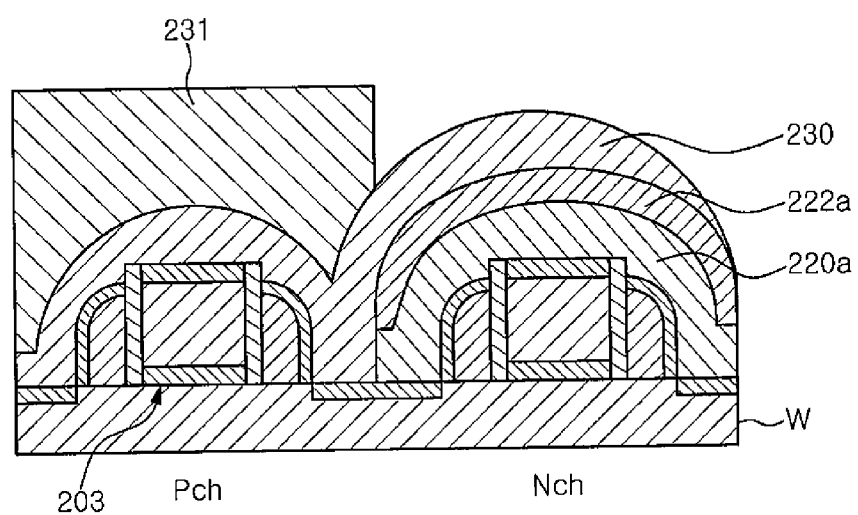

Thereafter, as shown in FIG. 1D, a silicon nitride film 230 that covers the PMOS transistor 203, a patterned silicon nitride film 220a, and a patterned silicon oxide film 222a to apply a compressive stress is formed on the substrate W. The silicon nitride film 230 is formed by, e.g., CVD. Next, a mask pattern that covers the PMOS transistor 203 and does not cover the NMOS transistor 204 is formed with a photoresist 231.

Figure 1E:
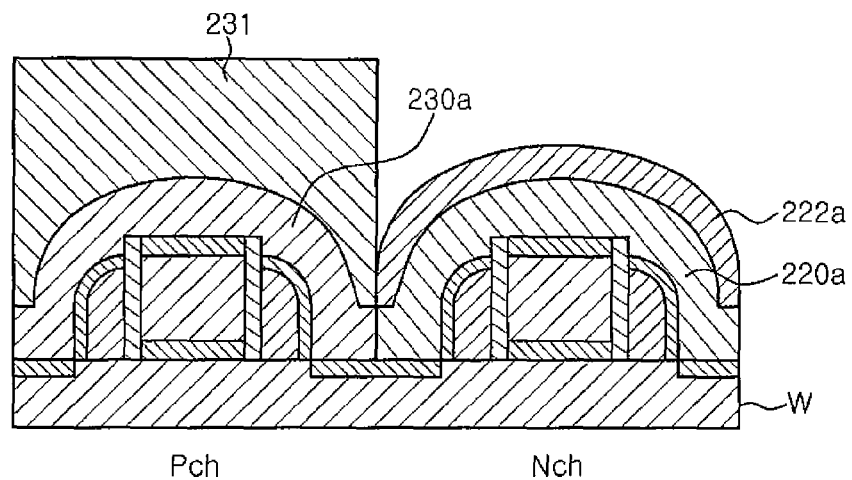

As shown in FIG. 1E, the silicon nitride film 230 on the NMOS transistor 204 is etched while using the photoresist 231 as a mask. When the silicon nitride film 230 is etched, the etching selectivity of the silicon nitride to the silicon oxide or the photoresist is high. The etching method of the present invention may be applied to the etching for the silicon nitride film 230.

Figure 1F:
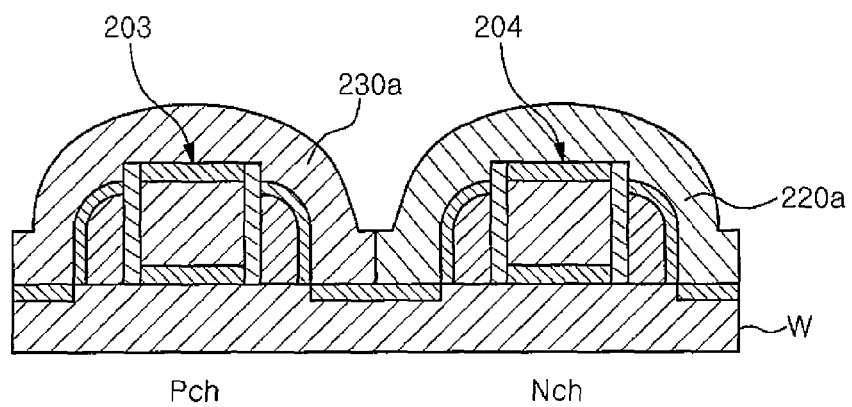

Then, as shown in FIG. 1F, the patterned silicon oxide film 222a on the NMOS transistor 204 is etched while using the photoresist 231 as a mask. Further, the etching method of the present invention may be applied to the etching of the silicon oxide film 222a.

When the photoresist is removed by ashing, the state in which the silicon nitride film 230a for applying compressive stress is formed on the PMOS transistor 203 and the silicon nitride film 220a for applying tensile stress is formed on the NMOS transistor 204 is obtained.

FIGS. 2A to 2E show processes of the etching method in accordance with the first embodiment of the present invention. In FIGS. 2A to 2E, the processes from FIG. 1B to FIG. 10 are illustrated in detail. The substrate W in which the photoresist 224 is deposited on the NMOS transistor 204 (see FIG. 2A) is transferred to an RLSA (Radial Line Slot Antenna) etching apparatus. The RLSA etching apparatus is characterized in that it can generate a plasma of a low electron temperature (low energy). The configuration and the characteristics of the RLSA etching apparatus will be described in detail.

The RLSA etching apparatus etches the silicon oxide film 222 and the silicon nitride film 220 which serve as insulating films on the PMOS transistor 203. The etching method in accordance with the first embodiment of the present invention includes a first etching (main etching) process for etching most of the silicon oxide film 222, an $O_2$ flash process as a deposit removal process for removing a deposit that has been generated on the silicon oxide film 222 in the first etching process, a second etching (over etching) process for removing the thin silicon oxide film 222 that has remained after the first etching process, and a silicon nitride film etching process for removing the silicon nitride film 220. All the processes are performed in the RLSA etching apparatus.

In the first etching process, a processing gas is introduced into the processing chamber of the RLSA etching apparatus and turned into a plasma. Hence, the silicon oxide film 222 on the PMOS transistor 203 is etched by the plasma thus generated while using the photoresist 224 as a mask (see FIG. 2A). In the first etching process, the etching selectivity of the silicon oxide to the silicon nitride needs to be high, and the etching needs to be performed while leaving the photoresist 224. Therefore, the etching needs to be performed while depositing a deposit ($CF_x$ or the like). Further, the silicon oxide film 222 is etched to a position thereof in a thickness direction. In detail, the silicon oxide film 222 is etched such that the thickness of the residual silicon oxide film 222 becomes about 5% to 20% of the thickness thereof before etching, i.e., the thickness of the residual silicon oxide film 222 becomes about 10 nm or below and preferably about 5 mm or below from a numerical point of view.

Table 1 shows an example of processing conditions of the first etching (main etching) process.

TABLE 1

| Processing gas | Ar: 450 sccm |
| --- | --- |
|  | $CHF_3$: 50 sccm |
|  | $O_2$: 2 sccm |
| Pressure in processing chamber | 20 mTorr |
| Microwave power | 2000 W |
| RF bias power | 85 W |
| Substrate temperature | 30° C. |
| Processing time | 3 min |

The processing gas is determined depending on a material to be etched. As for the processing gas, a gaseous mixture of an etching gas and a plasma excitation gas containing any one of Ar, He, Ne, Kr and Xe is used. As for the etching gas, a gaseous mixture of at least one selected from a group of $CH_2F_2$, $CHF_3$, and $CH_3F$, and at least one selected from a group of $O_2$, CO, CN, and $N_2$ is used. In this example in which the silicon oxide film is etched, a gaseous mixture of Ar, $CHF_3$, and $O_2$ is used. When a CHF-based gas is used as an etching gas, a deposit is generated on the substrate W. $O_2$, CO, CN, $N_2$ or the like is used to control the amount of carbon in the deposit.

Figure 2A:
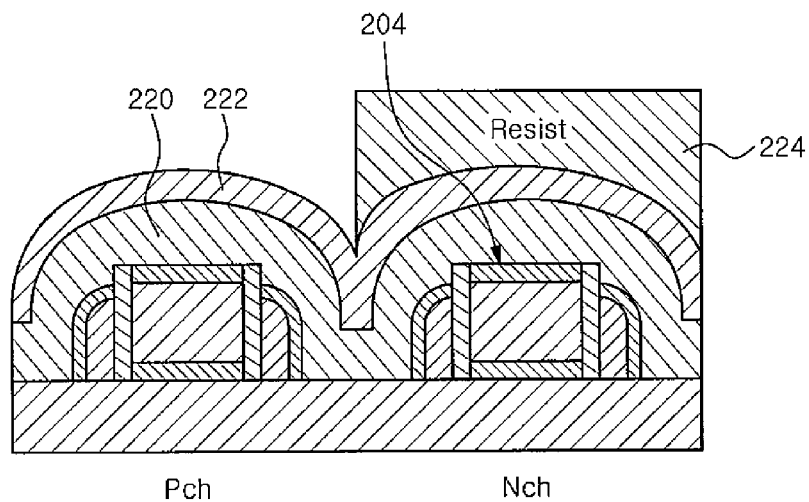
FIGS. 2A to 2E show processes of the etching method in accordance with the first embodiment of the present invention.
Figure 2B:
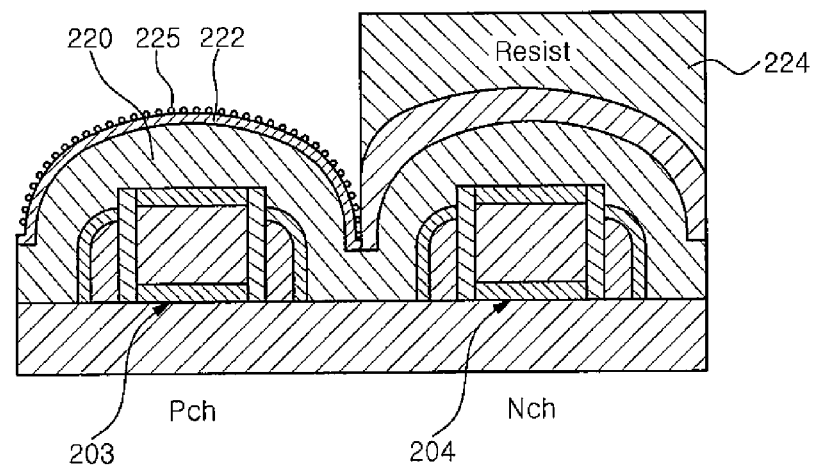

As shown in FIG. 2B, after the first etching (main etching) process is completed, the thin silicon oxide film 222 remains on the silicon nitride film 220, and CF-based deposits 225 remain on the silicon oxide film 222. The deposits 225 contain at least carbon and fluorine and are deposited on the silicon oxide film 222 during the first etching process. In order to remove the deposits 225, the $O_2$ flash process for removing the deposits 225 is performed. Here, the $O_2$ flash process is a process for exposing a film to be processed to a low energy oxygen plasma. As a consequence, the deposits can be removed.

In the $O_2$ flash process for removing the deposits 225, an oxygen plasma ($O_2$ flash) is generated in the RLSA etching apparatus. In other words, oxygen gas is introduced into the processing chamber of the RLSA etching apparatus, and the oxygen plasma is generated in the processing chamber. When the deposits 225 are exposed to the oxygen plasma, oxygen radicals in the plasma react with the deposits 225, thereby generating carbon dioxide and water. The carbon dioxide and the water are removed by evaporation and evacuation. Since the thin silicon oxide film 222 remains on the silicon nitride film 220, the surface layer of the silicon nitride film 220 is not oxidized and thus not changed to silicon oxide even upon completion of the $O_2$ flash process. Further, since the silicon oxide film 222 has been already oxidized, it hardly changes during the $O_2$ flash process.

Here, if it is assumed that the $O_2$ flash process is not performed, a CF-based deposit is deposited on the surface of the silicon nitride film 220 upon completion of the etching of the silicon oxide film 222. When the CF-based deposit is deposited, the CF-based deposit serves as an etching mask and, thus, the etching of the silicon nitride film 220 does not occur locally. This problem can be avoided by removing the CF-based deposit. Further, in accordance with the present embodiment, when the $O_2$ flash process is carried out, the thin silicon oxide film 222 remains the surface of the silicon nitride film 220. Therefore, the surface of the silicon nitride film 220 can be prevented from being oxidized by the oxygen plasma.

The deposits 225 are processed by the oxygen plasma under the conditions shown in Table 2.

TABLE 2

| Processing gas | $O_2$: 20 sccm |
| --- | --- |
| Pressure | 100 mTorr |
| Microwave power | 3000 W |
| RF bias power | 0 W |
| Substrate temperature | 30° C. |
| Processing time | 10 sec |

The photoresist 224 is formed on the NMOS transistor 204 (see FIG. 2B). The photoresist 224 contains carbon and fluorine. Therefore, if the $O_2$ flash process is intensively performed, the photoresist 224 is coupled with oxygen radicals in the plasma, thereby generating carbon dioxide and water which are evaporated and removed. In order to prevent the removal of the photoresist 224, an oxygen plasma of a low electron temperature needs to be used. Further, the silicon nitride film 220 is formed below the thin silicon oxide film 222. In order to prevent the silicon nitride film 220 from being oxidized by the oxygen plasma via the thin silicon oxide film 222, the electron temperature of the oxygen plasma needs to be low. An oxygen plasma of a low electron temperature, i.e., an oxygen plasma of a low energy, can be generated by using the RLSA etching apparatus and setting the pressure in the chamber to about 100 mTorr or above and the microwave power to about 3000 W or less. The oxygen plasma processing time is set to about 10 seconds so that adverse effect is not inflicted on the photoresist 224 or the silicon nitride film 220 as a base.

Figure 2C:
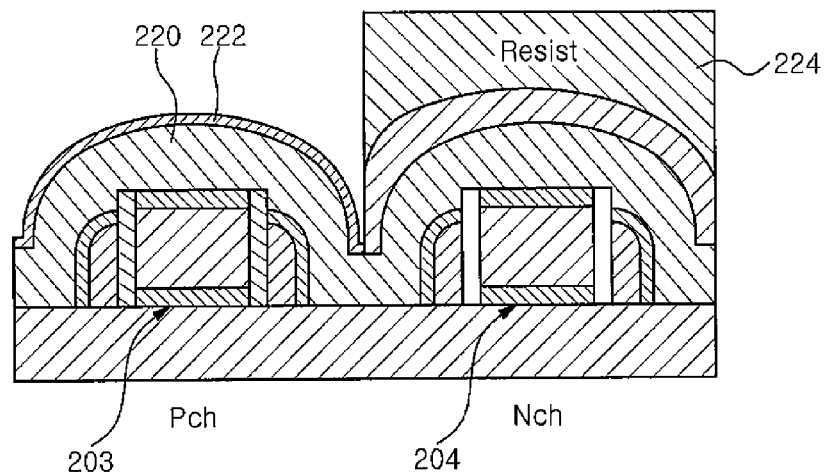

As shown in FIG. 2C, the deposits 225 on the surface of the silicon oxide film 222 are removed by the $O_2$ flash process. The thin silicon oxide film 222 whose thickness has been reduced to about 100 nm or less is formed on the silicon nitride film 220. The second etching (over etching) process in which etching selectivity of silicon oxide to silicon nitride is increased is performed to remove the entire thin silicon oxide film 222 in a thickness direction. The second etching process is carried out while depositing a deposit ($CF_x$ or the like).

Table 3 shows an example of processing conditions of the second etching process.

TABLE 3

| Processing gas | Ar: 450 sccm |
| --- | --- |
|  | $CHF_3$: 50 sccm |
|  | $O_2$: 2 sccm |
| Pressure | 20 mTorr |
| Microwave power | 2000 W |
| RF bias power | 100 W |
| Substrate temperature | 30° C. |
| Processing time | 60 sec |

In the second etching process, the same processing gas as that used in the first etching process is used. However, the RF bias is slightly increased compared to that in the first etching process, and the processing timing is reduced to about 60 seconds.

Figure 2D:
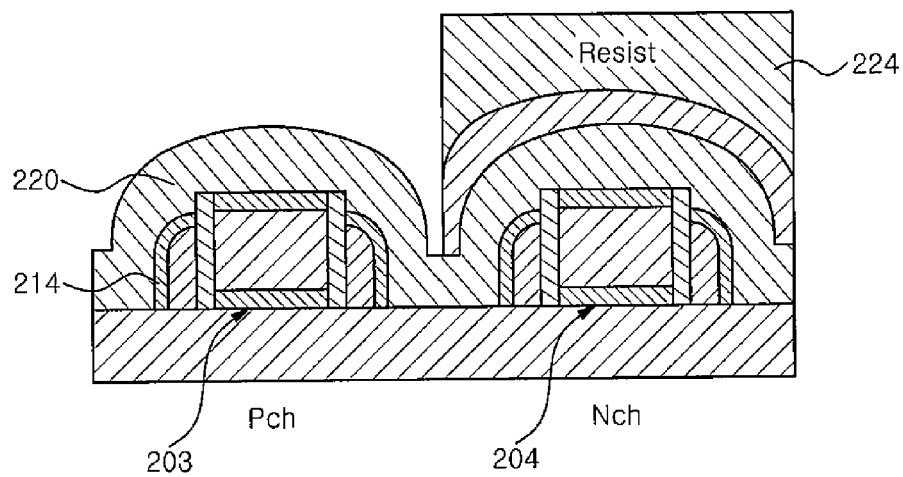

As shown in FIG. 2D, the silicon oxide film 222 is removed by the second etching (over etching) process. A deposit is generated in the second etching process. Since, however, the thickness of the silicon oxide film 222 is reduced to about 10% of the initial thickness thereof, the amount of the deposit generated in the second etching process is small. On the assumption that the amount of the deposit is in direct proportion to the etched amount, the amount of the deposit is also reduced to about 10% of an amount of the deposit which can be generated in a case where the whole of the initial silicon oxide film 222 is removed. When the amount of the deposit is decreased, the silicon nitride film 220 can be uniformly etched without removing the deposit.

After the etching of the silicon oxide film 222 is completed, the photoresist 224 on the NMOS transistor 204 is removed by ashing. In this ashing process, the etching selectivity of the photoresist to the silicon nitride or the silicon oxide needs to be increased.

The silicon nitride film 220 on the PMOS transistor 203 is entirely removed in a thick direction by the silicon nitride film etching process. In the silicon nitride film etching process, a processing gas is introduced into the processing chamber of the RLSA etching apparatus to etch the silicon nitride film 220. The surface of the silicon nitride film 220 is not oxidized, and the amount of the deposit deposited on the surface is small. Accordingly, the silicon nitride film 220 can be etched without performing the $O_2$ flash process. Further, since the silicon oxide film 214 (spacer of the PMOS transistor 203) is formed below the silicon nitride film 220, the etching in which the etching selectivity of silicon nitride to silicon oxide is high is required.

Table 4 shows an example of processing conditions of etching process of the silicon nitride film.

TABLE 4

| Processing gas | Ar: 1000 sccm |
| --- | --- |
|  | $CH_2F_2$: 45 sccm |
|  | $O_2$: 15-50 sccm |
|  | (preferably, about 30 sccm) |
| Pressure | 500 mTorr |
| Microwave power | 2500 W |
| RF bias power | 0 W |
| Substrate temperature | 30° C. |
| Processing time | 60 sec |

The processing gas is determined depending on a material to be etched. As for the processing gas, a gaseous mixture of an etching gas and a plasma excitation gas containing any one of Ar, He, Ne, Kr and Xe is used. As for the etching gas, a gaseous mixture of at least one selected from a group of $CH_2F_2$, $CHF_3$, and $CH_3F$, and at least one selected from a group of $O_2$, CO, CN, and $N_2$ is used. In this example in which the silicon nitride film 220 is etched, a gaseous mixture of Ar, $CH_2F_2$, and $O_2$ is used. In the silicon nitride film etching process, the pressure may be set to two levels shifted from a low pressure to high pressure.

The ion energy irradiated to the substrate W has correlation with the sum of the plasma energy and the bias voltage applied to the substrate W. By setting the RF bias to zero, the etching can be performed only by the plasma energy. Further, the electron temperature of the plasma, i.e., the energy of the plasma, can be decreased by performing the etching at a high pressure of about 500 mTorr. Since the sum of the RF bias and the energy of plasma can be reduced, the silicon oxide film 214 as a base or the silicon wafer W can be prevented from being damaged (recessed).

Figure 2E:
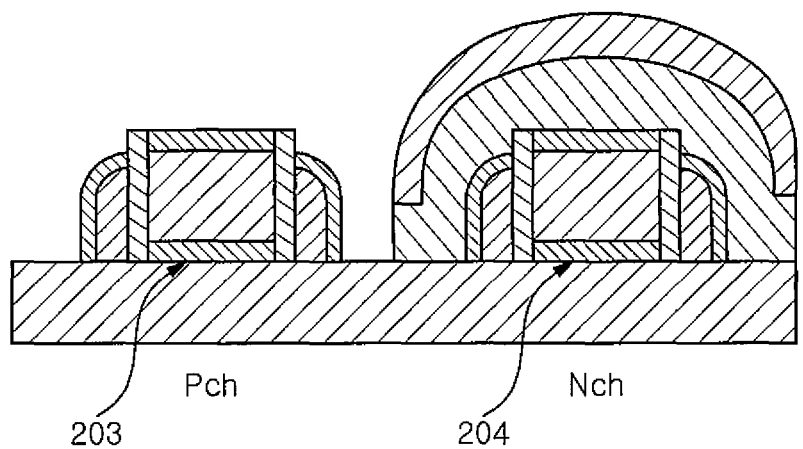

After the etching of the silicon oxide film 222 and the silicon nitride film 220 on the PMOS transistor 203 is completed, the state shown in FIG. 2E (the same as that shown in FIG. 1C) is obtained.

FIGS. 3A to 3D show results of tests of examining an etching rate of a photoresist under different pressures. In these tests, the $O_2$ flash process was performed by supplying a microwave power of about 3000 W to a KrF resist for 10 seconds. In FIGS. 3A to 3D, the unit of the horizontal axis is mm, and the unit of the vertical axis is Å. The etching rates in four directions, i.e., X, Y, V and W axes, on the substrate W were measured. Zero on the horizontal axis represents the center of the substrate W.

Figure 3A:
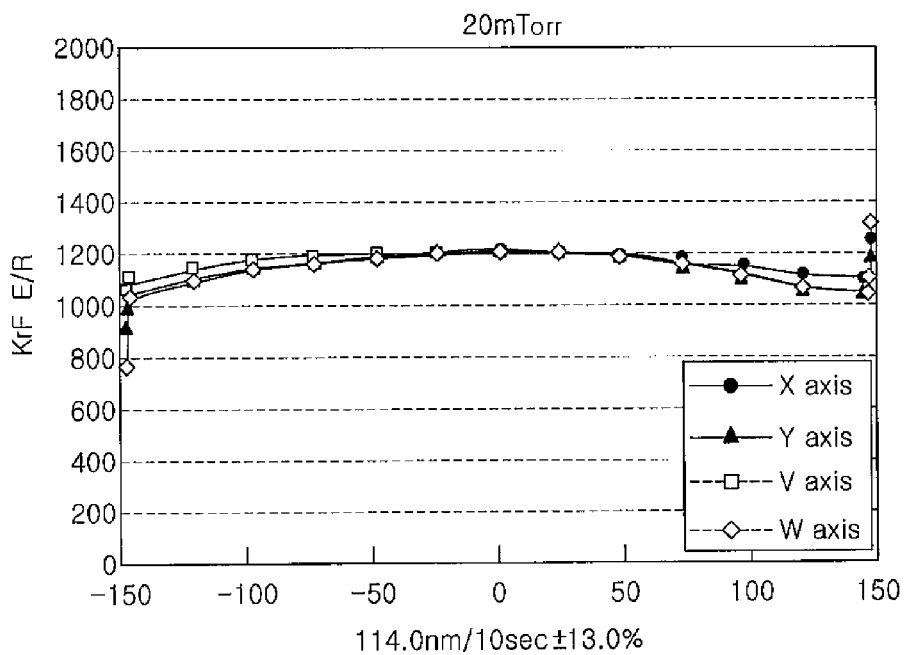
FIGS. 3A to 3D show results of tests of examining an etching rate of a photoresist under different pressures.
Figure 3B:
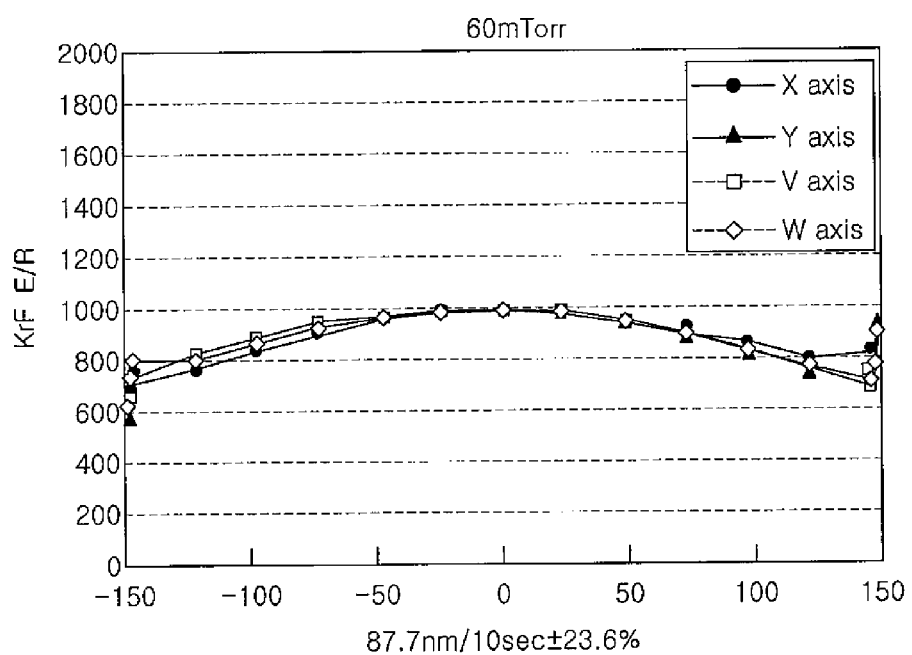

Referring to FIG. 3A, when the pressure was about 20 mTorr, the etching rate was about 114.0 nm for 10 seconds, which was relatively high. Referring to FIG. 3B, when the pressure was about 60 mTorr, the etching rate was about 87.7 nm for about 10 seconds, which was still high. The etching rate of the photoresist under the pressure of about 60 mTorr is still high, so that the $O_2$ flash process needs to be performed at a pressure higher than about 60 mTorr in order to further reduce the etching rate.

Figure 3C:
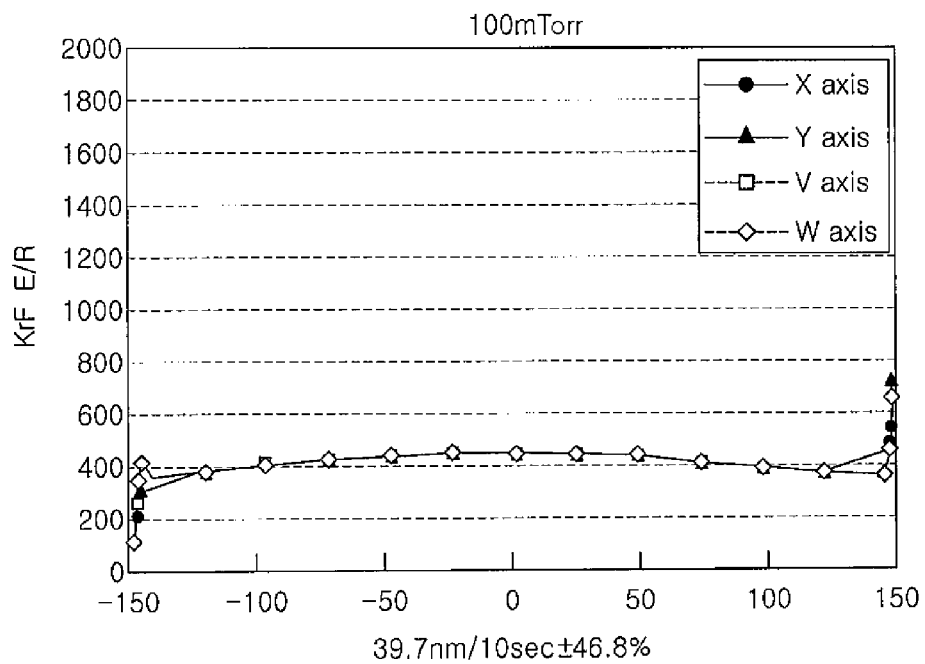
Figure 3D:
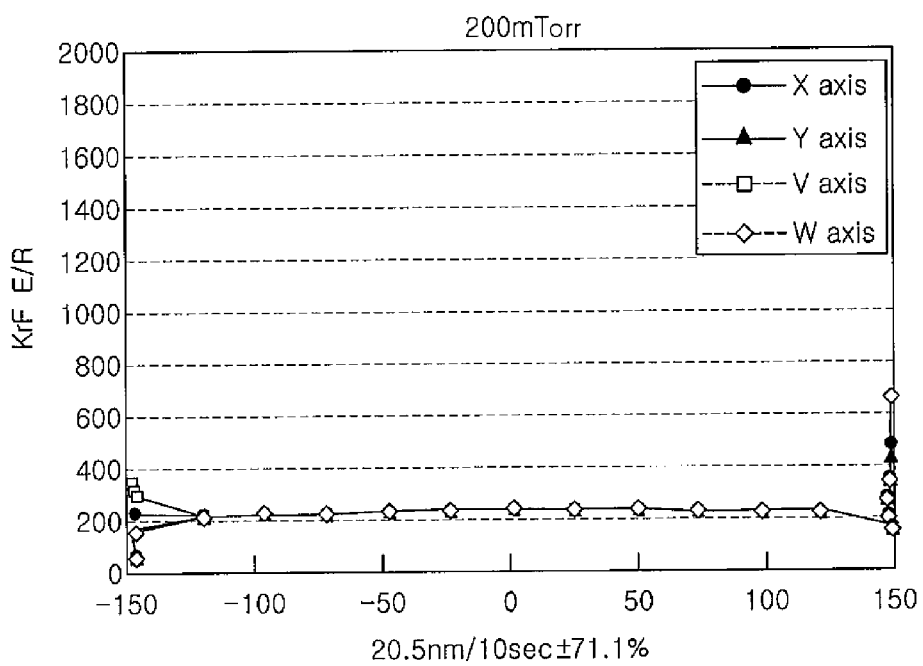

Referring to FIG. 3C, when the pressure was about 100 mTorr, the etching rate was about 39.7 nm for 10 seconds, which was relatively low. In order to reduce the etching rate to be less than about 39.7 nm/10 sec, the $O_2$ flash process is preferably performed under the pressure higher than about 100 mTorr. Referring to FIG. 3D, when the pressure was about 200 mTorr, the etching rate was about 20.5 nm for 10 seconds, which was further lower. Since the etching rate can be further decreased than that under the pressure of about 100 mTorr, the $O_2$ flash process may be performed under the pressure of about 200 mTorr.

Figure 4A:
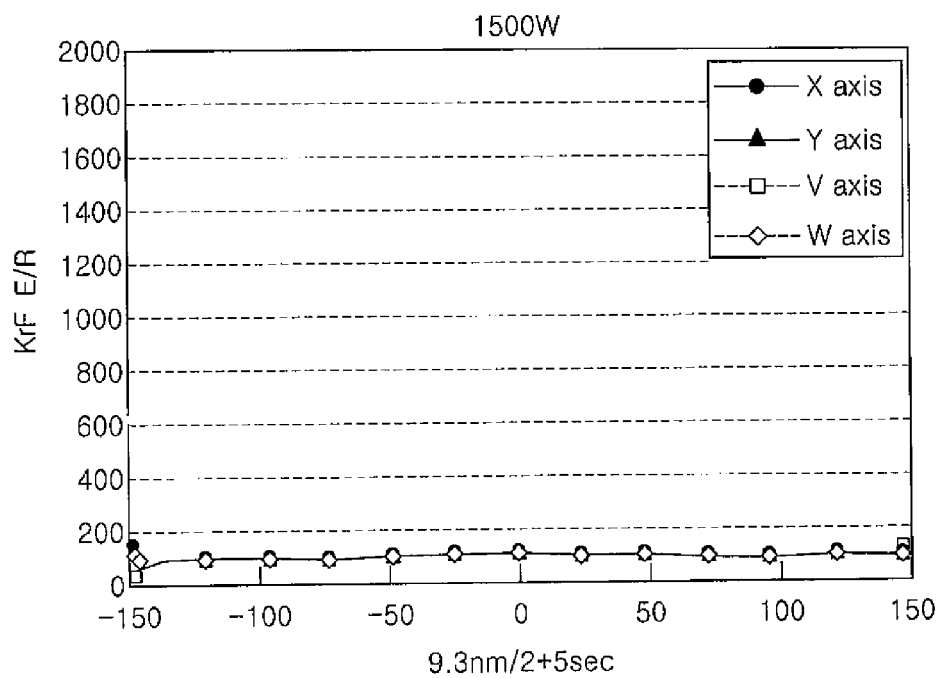
FIGS. 4A to 4C show results of tests of examining an etching rate of a photoresist under different microwave powers.
Figure 4B:
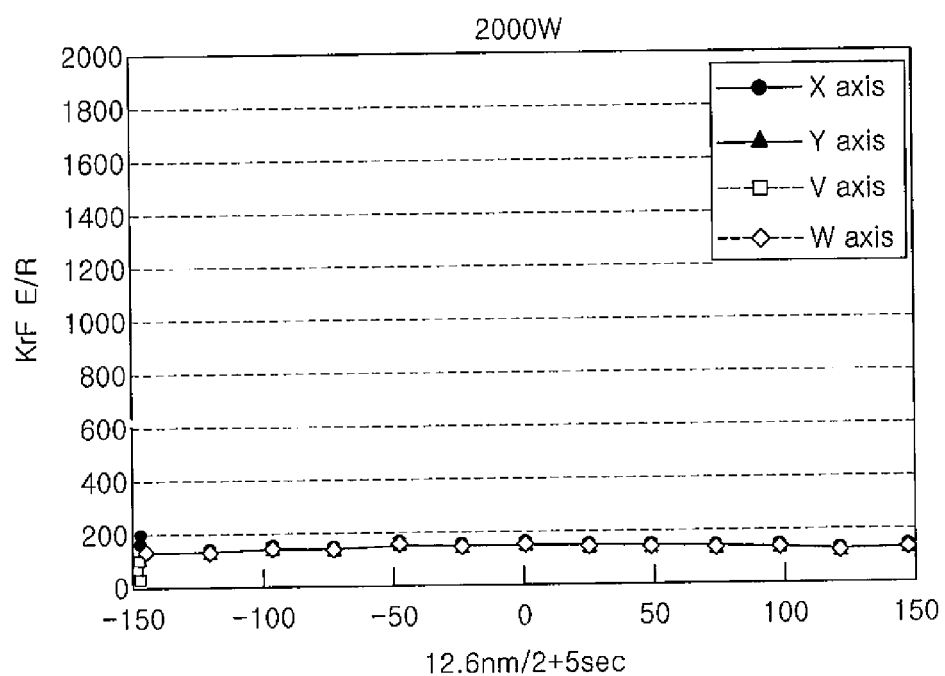
Figure 4C:
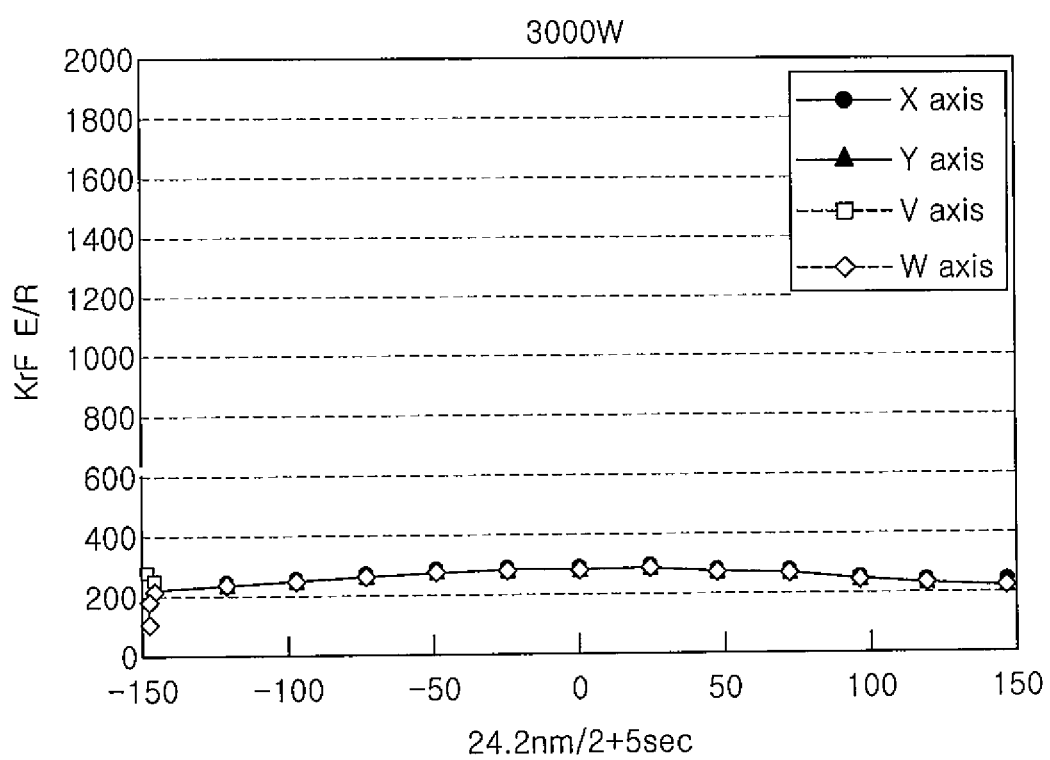

FIGS. 4A to 4C show results of tests of examining an etching rate of a photoresist in the case of varying a microwave power. The $O_2$ flash process was performed by supplying microwave powers of about 1500 W, 2000 W and 3000 W to a KrF resist under the pressure of about 100 mTorr for about 5 seconds.

Referring to FIG. 4A, when the microwave power was about 1500 W, the etching rate was about 9.3 nm for 2 seconds, which was relatively low. Referring to FIG. 4B, when the microwave power was about 2000 W, the etching rate was about 12.6 nm for 2 seconds, which was slightly higher but still low. Referring to FIG. 4C, when the microwave power was about 3000 W, the etching rate was about 24.2 nm for 2 seconds, which was twice higher than that in the case where the microwave power was about 2000 W. In order to reduce the etching rate, the power of microwave is preferably set to about 2000 W. Further, the microwave power may be set to about 1500 W because the etching rate can be further reduced when the microwave power is about 1500 W.

Figure 5A:
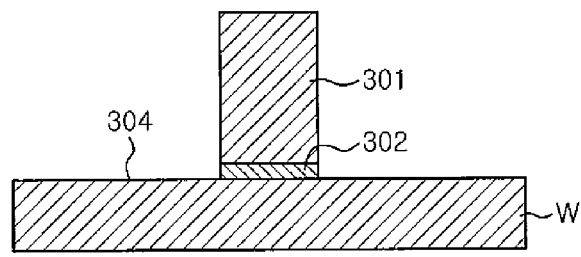
FIGS. 5A to 5J show processes of a MOSFET manufacturing method to which an etching method in accordance with a second embodiment of the present invention is applied.
Figure 5B:
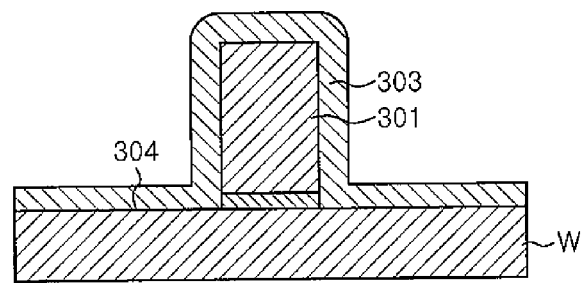

FIGS. 5A to 5F illustrate a semiconductor device manufacturing method, e.g., a MOSFET manufacturing method, to which an etching method in accordance with the second embodiment of the present invention is applied. As shown in FIG. 5A, a gate electrode 301 made of polysilicon is formed on a surface of a silicon substrate W via a gate insulating film 302, e.g., a silicon oxide film. Then, as shown in FIG. 5B, a silicon oxide ($SiO_2$) film 303 is formed on the surface of the silicon substrate W and the surface of the gate electrode 301 by CVD.

Then, the silicon substrate W is transferred to an RLSA etching apparatus. In the RLSA etching apparatus, the deposited silicon oxide 303 is etched to form an offset spacer 303a (see FIG. 5E) on a sidewall of a gate electrode 301.

The etching method in accordance with the second embodiment of the present invention is applied to the processes from FIGS. 5B to 5E. The etching method in accordance with the second embodiment includes: a first etching (main etching) process for etching most of the silicon oxide film 303; an $O_2$ flash process for removing a deposit that has been generated in the first etching process; and a second etching (over etching) process for removing the thin silicon oxide film 303 that has remained after the first etching process. All the processes are performed in the RLSA etching apparatus.

In the first etching process, a processing gas is introduced into the processing chamber of the RLSA etching apparatus and turned into a plasma, so that the silicon oxide film 303 is etched. In the first etching process, the etching selectivity of the silicon oxide to the silicon or the polysilicon needs to be high, and the silicon oxide film 303 is etched in a thickness direction such that the thickness thereof becomes, e.g., about 5% to 20% of the initial thickness while generating a deposit $(CF_x)$.

Figure 5C:
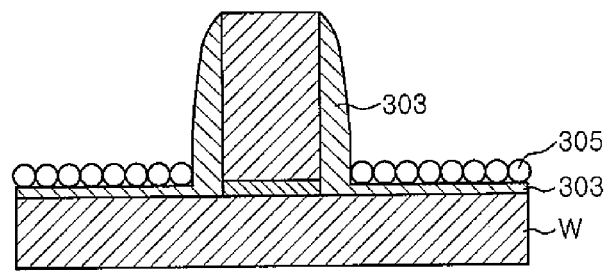

As shown in FIG. 5C, upon completion of the first etching process, the thin silicon oxide film 303 remains on the silicon substrate W, and deposits 305 are adhered on the silicon oxide film 303. The deposits 305 contain at least carbon. The $O_2$ flash process is performed in order to remove the deposits 305.

In the $O_2$ flash process for removing the deposits 305, the oxygen plasma is generated ($O_2$ flash) in the RLSA etching apparatus. When the deposits 305 are exposed to the oxygen plasma, the deposits are coupled with oxygen radicals in the plasma, thereby generating carbon dioxide and water. The carbon dioxide and the water are evaporated and removed. Since the thin silicon oxide film 303 remains on the silicon substrate W, the silicon substrate W is not oxidized even by the $O_2$ flash process, and the silicon substrate W is prevented from being damaged (recessed).

Figure 5D:
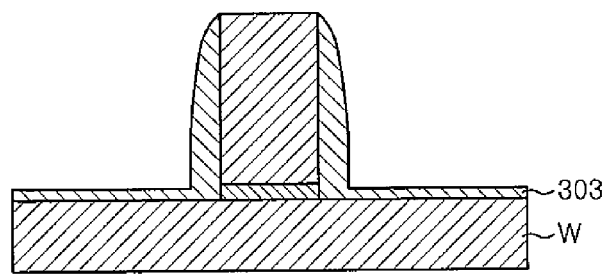
Figure 5E:
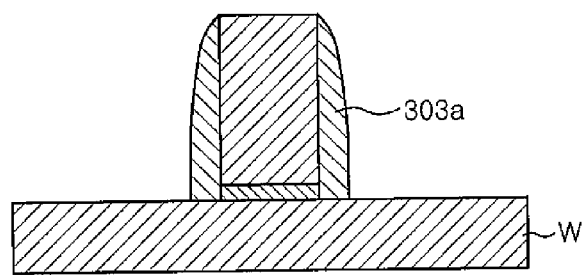

The deposits on the surface of the silicon oxide film 303 are removed by the $O_2$ flash process (see FIG. 5D). The silicon oxide film 303 whose thickness has been reduced to about 10% of the initial thickness is formed on the silicon substrate W. The second etching process, in which etching selectivity of silicon oxide to the silicon substrate W or polysilicon is high, is performed to remove the entire thin silicon oxide film 303 in a thickness direction. The second etching process is performed while generating a deposit ($CF_x$ or the like). Since, however, the silicon oxide film 303 is thin, the amount of the deposit is also small. Further, the $O_2$ flash process may be carried out again if necessary. Upon completion of the second etching process, the surface of the silicon substrate W is exposed (see FIG. 5E).

Figure 5F:
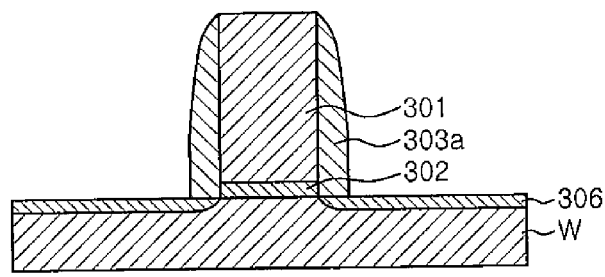
Figure 5G:
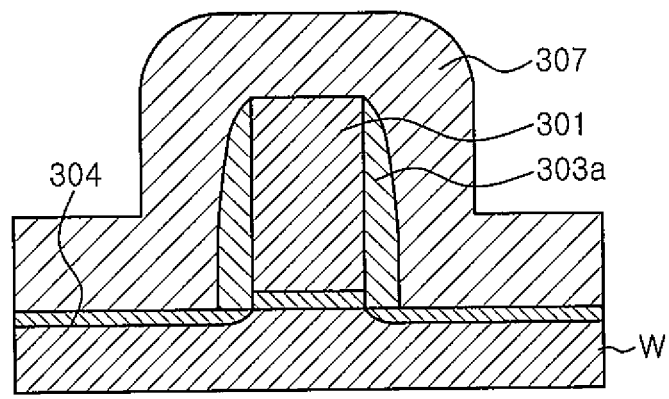

Then, as shown in FIG. 5F, ions are implanted into the silicon substrate W in order to form an extension region 306 in the silicon substrate W. Thereafter, in order to form a sidewall spacer 307a, a silicon nitride film 307 is formed so as to cover a surface 304 of the silicon substrate W and the gate electrode 301, as shown in FIG. 5G. The silicon nitride film 307 is formed by CVD.

Next, in the RLSA etching apparatus, the silicon nitride film 307 is etched to form a sidewall spacer 307a (see FIG. 5J) on a sidewall of the gate electrode 301.

An etching method in accordance with a third embodiment of the present invention is applied to the processes from FIGS. 5G to 5J. The etching method in accordance with the third embodiment includes: a first etching (main etching) process for etching most of the silicon nitride film 307; an $O_2$ flash process for removing a deposit that has been generated in the first etching process; and a second etching (over etching) process for removing the thin silicon nitride film 307 that has remained after the first etching process. All the processes are performed in the RLSA etching apparatus.

In the first etching process, a processing gas is introduced into the processing chamber of the RLSA etching apparatus and turned into a plasma to etch the silicon nitride film 307. In the first etching process, the etching selectivity of silicon nitride to silicon or polysilicon needs to be increased, and the etching is carried out while depositing a deposit ($CF_x$) such that the thickness thereof becomes, e.g., about 5% to 20% of the initial thickness.

Figure 5H:
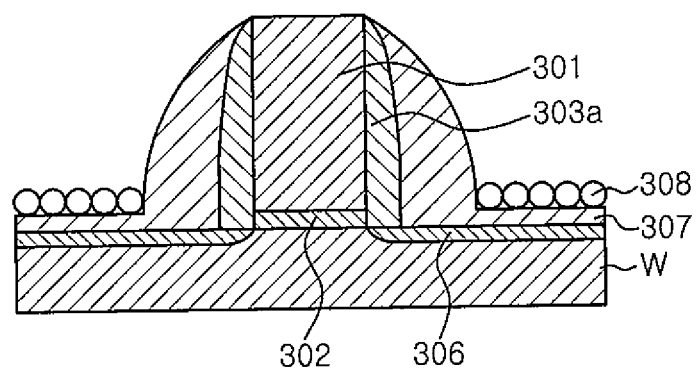

As shown in FIG. 5H, after the first etching process is completed, a thin silicon nitride film 307 remains on the silicon substrate W, and deposits 308 are deposited on the silicon nitride film 307. The deposits 308 contain at least carbon and fluorine. The $O_2$ flash process is performed to remove the deposits 308.

In the $O_2$ flash process for removing the deposits 308, the oxygen plasma is generated in the RLSA etching apparatus. When the deposits 308 are exposed to the oxygen plasma, the deposits 308 are coupled with oxygen radicals in the plasma, thereby generating carbon dioxide and water. The carbon dioxide and the water are evaporated and removed. Since the thin silicon nitride film 307 remains on the silicon substrate W, the silicon substrate W is not oxidized even by the $O_2$ flash process, and the silicon substrate W is prevented from being damaged (recessed).

Figure 5I:
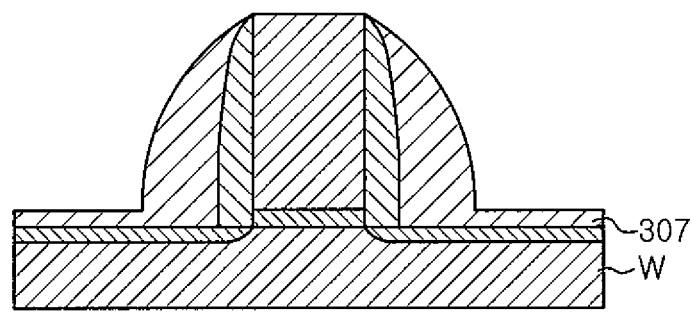

When the deposits 308 on the surface of the silicon nitride film 307 are removed by the $O_2$ flash process, the state, in which the silicon nitride film 307 whose thickness has been reduced to about 10% of the initial thickness is formed on the silicon substrate W, is obtained (see FIG. 5I). In order to remove the entire thin silicon nitride film 307 in a thickness direction, the second etching process in which etching selectivity of silicon nitride to the silicon substrate W or polysilicon is increased is performed. The second etching process is carried out while protecting the sidewall with a deposit ($CF_x$ or the like). Since, however, the silicon nitride film 307 is thin, the amount of the deposit is also small. Moreover, the $O_2$ flash process may be performed again if necessary.

Figure 5J:
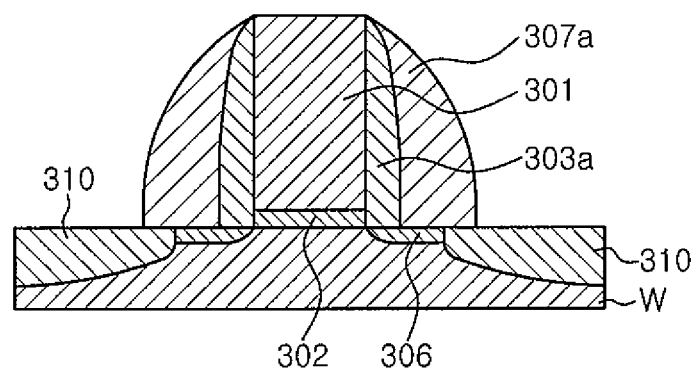

Next, As ions are implanted into the silicon substrate W in order to form a source/drain area 310 (see FIG. 5J). By forming the sidewall spacer 307a, the high concentration source/drain area 310 can be formed at an outer side of the extension region 306.

In this semiconductor device manufacturing method, both of the offset spacer and the sidewall spacer are formed. However, only the sidewall spacer may be formed without forming the offset spacer.

In the etching methods of the first to the third embodiment, the RLSA etching apparatus is used. However, another plasma processing apparatus capable generating a plasma may also be used. The configuration of the RLSA etching apparatus will be described as follows.

Figure 6:
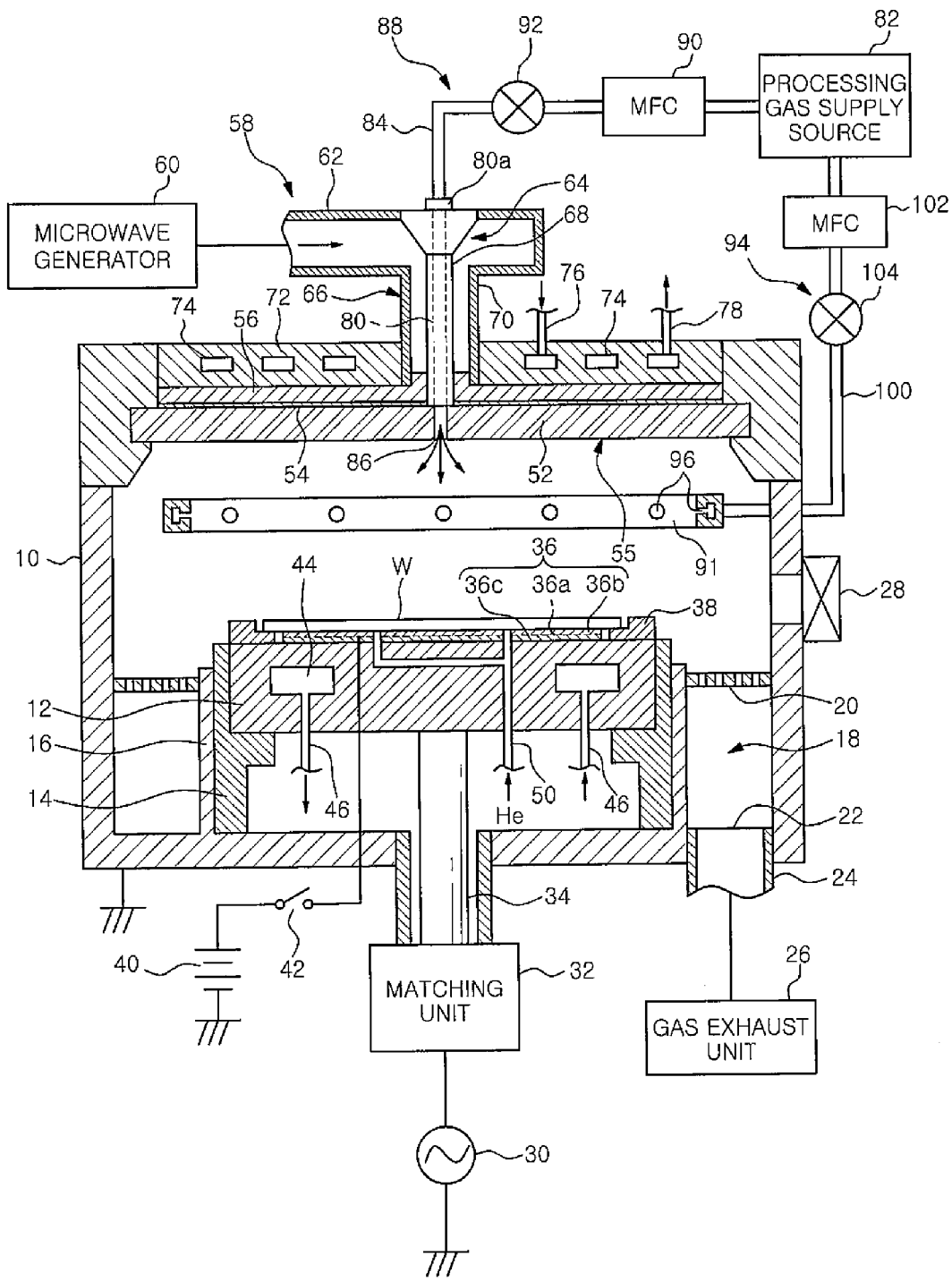
FIG. 6 shows a schematic cross sectional view of an RLSA etching apparatus.

FIG. 6 is a schematic cross sectional view of the RLSA etching apparatus. The RLSA etching apparatus uses a microwave excitation plasma as a plasma source. When the microwave excitation plasma is used, a plasma having a low electron temperature and a high density can be generated in a region where an etching process is carried out.

Figure 7:
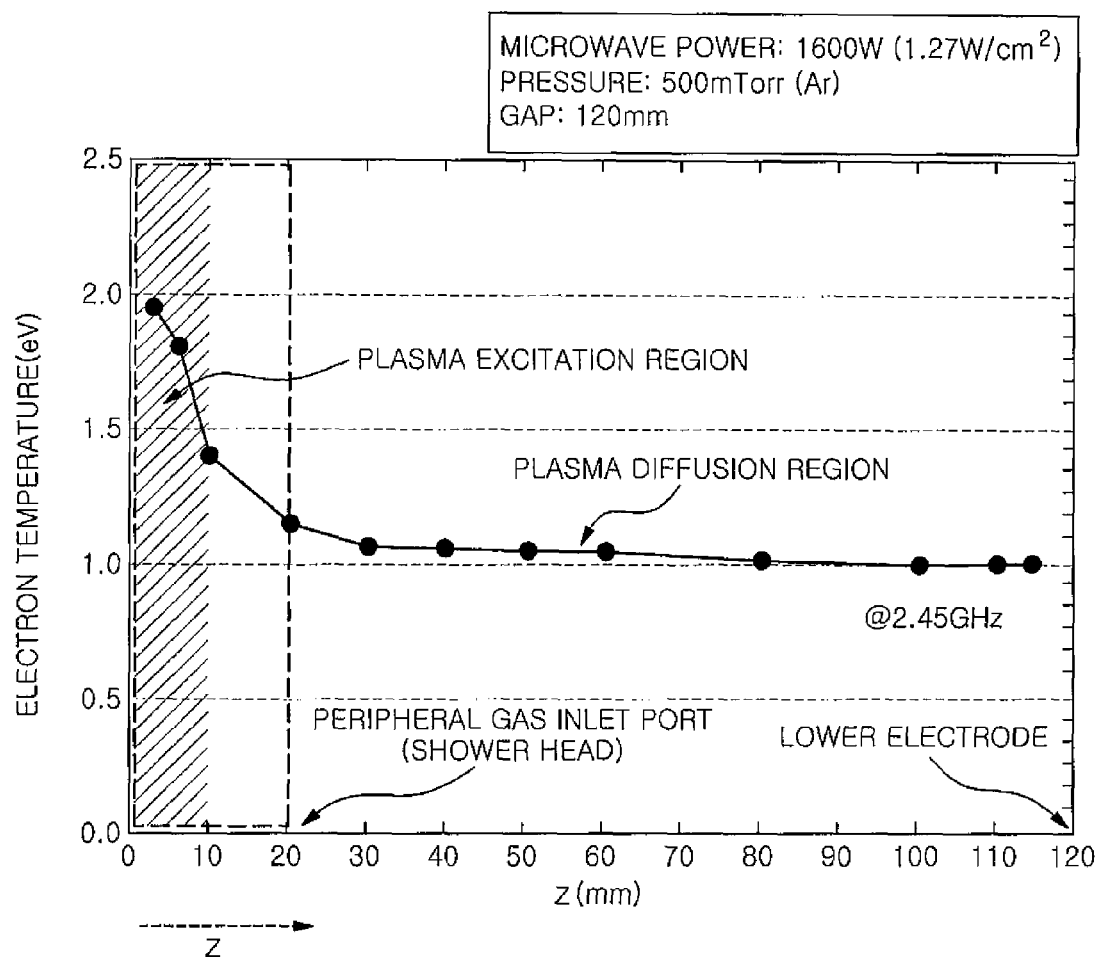
FIG. 7 shows a graph showing relationship between a distance Z of a dielectric window of the RLSA etching apparatus and an electron temperature of a plasma.

The microwave plasma produced by the RLSA etching apparatus is characterized in that a plasma of a few eV which is generated immediately below a dielectric window 52 (referred to as "plasma excitation region") is diffused and becomes a plasma having a low electron temperature of about 1 eV to 2 eV immediately above the substrate W (referred to as "plasma diffusion region"). In other words, it is characterized in that the distribution of the electron temperature of the plasma is expressed as a function of a distance from the dielectric window 52 unlike a plasma generated in parallel plate type or the like. More specifically, as shown in FIG. 7, the electron temperature of a few eV to 10 eV immediately below the dielectric window 52 is decreased to about 1 eV to 2 eV on the substrate W. The substrate W is processed at a region where the electron temperature of the plasma is low (plasma diffusion region), so that the substrate W is protected from damages such as recesses and the like.

The RLSA etching apparatus includes a cylindrical processing chamber 10 made of aluminum alloy, stainless alloy or the like. The processing chamber 10 is grounded.

First, components or members which do not directly contribute to the generation of the microwave excitation plasma in the processing chamber 10 of the RLSA etching apparatus will be described.

A susceptor 12 serving as a mounting table for mounting thereon the substrate W is provided at a center of a bottom portion of the processing chamber 10. The susceptor 12 is maintained by a cylindrical support 14 extending upward from the bottom portion of the processing chamber 10. The susceptor 12 is made of an insulating material, e.g., alumina, alumina nitride or the like, and formed in a disc shape. The susceptor 12 serves as a lower electrode to which a high frequency is applied.

An exhaust path 18 of a circularly annular shape is provided between an inner surface of the processing chamber 10 and a cylindrical wall portion 16 extending upward from the bottom portion of the processing chamber 10 and surrounding the cylindrical support 14. A baffle plate 20 of a circularly annular shape is provided at an upper portion of the exhaust path 18, and an exhaust port 22 is provided at a bottom portion of the exhaust path 18. A plurality of exhaust ports 22 is provided with the exhaust path 18 and the exhaust ports 22 are spaced at regular angles in order to obtain uniform gas flow distributed symmetrically with respect to the substrate W on the susceptor 12. Each of the exhaust ports 22 is connected to an exhaust unit 26 via an exhaust pipe 24. The exhaust unit 26 includes a vacuum pump such as a TMP (Turbo Molecular vacuum Pump) serving as an exhaust device for evacuating the processing chamber 10 to vacuum and decreasing the pressure therein to a desired level. A gate valve 28 opens or closes a transfer port through which the substrate W is loaded into and unloaded from the processing chamber.

The susceptor 12 is electrically connected to a high frequency power supply 30 for applying an RF bias voltage to the susceptor 12 via a matching unit 32 and a power supply rod 34. The high frequency power supply 30 outputs a high frequency power having a relatively low frequency of, e.g., 13.56 MHz, at a predetermined power level. Such a low frequency is suitable to control the energy of ions to be attracted to the wafer W on the susceptor 12. The matching unit 32 includes a matching element for matching an output impedance of the high frequency power supply 30 with an impedance of a load including the electrode (the susceptor 12), the plasma generated in the processing chamber 10, and the processing chamber 10. The matching element has a blocking capacitor for generating a self bias.

An electrostatic chuck 36 is provided on the top surface of the susceptor 12. The electrostatic chuck 36 holds the wafer W by electrostatic force on the susceptor 12. The electrostatic chuck 36 has an electrode 36a formed of a conductive film and a pair of insulating films 36b and 36c that sandwich the electrode 36a. A DC power supply 40 is electrically connected to the electrode 36a via a switch 42. A DC voltage applied to the electrostatic chuck 36 from the DC power supply 40 produces a Coulomb force for holding the wafer W on the electrostatic chuck 36. A focus ring 38 that surrounds the substrate W is provided at an outer periphery of the electrostatic chuck 36.

A coolant channel 44 is provided inside the susceptor 12. The coolant channel 44 extends in a circumferential direction and is formed in a circular ring shape. A coolant or cooling water at a predetermined temperature is supplied to the coolant channel 44 through a conduction line 46 from a chiller unit (not shown) so as to circulate through the coolant channel 44 and the conduction line 46. By controlling the temperature of the coolant, the temperature of the wafer W on the electrostatic chuck 36 may be controlled. Further, a thermally conductive gas such as He gas or the like is supplied between the wafer W and the electrostatic chuck through a gas supply pipe 50 from a gas supply unit (not shown).

Hereinafter, components or members which contribute to the generation of the microwave plasma in the processing chamber 10 of the RLSA etching apparatus will be described.

The planar antenna 55 includes a disc-shaped dielectric window 52 made of a dielectric material such as quartz, ceramic, alumina ($Al_2O_3$), aluminum nitride (AlN) or the like, and a circular plate-shaped slot antenna 54. The dielectric window 52 is attached to the processing chamber 10 to seal the inside of the processing chamber and serves as a ceiling portion of the processing chamber 11 which faces the susceptor 12. The slot antenna 54 is located on the top surface of the dielectric window 52 and has a plurality of slots distributed in concentric circles. The slot antenna 54 is electromagnetically connected to a microwave inlet line 58 via a dielectric plate 56 serving as a wavelength reducing plate made of a dielectric material such as quartz or the like.

The microwave inlet line 58 includes a waveguide 62, a waveguide/coaxial tube converter 64 and a coaxial tube 66, and transfers a microwave outputted from a microwave generator 60 to the slot antenna 54. The waveguide 62 is formed of, e.g., a rectangular pipe, and transfers the microwave in a TE mode from the microwave generator 60 to the converter 64.

The converter 64 connects the waveguide 62 to the coaxial tube 66 and converts the TE mode microwave in the waveguide 62 to a TEM mode microwave in the coaxial tube 66. The converter 64 is formed in a cone shape downwardly tapering, and has a top portion connected to the waveguide 62 and a bottom portion connected to an inner conductor 68 of the coaxial tube 66.

The coaxial pipe 66 extends vertically downward from the converter 64 to an upper center portion of the processing chamber 10 and is connected to the slot antenna 54. The coaxial pipe 66 has an outer conductor 70 and the inner conductor 68. The outer conductor 70 has an upper end portion connected to the waveguide 62 and a lower end portion extending vertically downward to be connected to the dielectric plate 56. The inner conductor 68 has an upper end portion connected to the converter 64 and a lower end portion that extends vertically downward to reach the slot antenna 54. The microwave propagates in the TEM mode between the inner conductor 68 and the outer conductor 70.

The microwave output from the microwave generator is transmitted to the microwave inlet line 58 including the waveguide 62, the converter 64 and the coaxial pipe 66, and then supplied to the slot antenna 54 after passing through the dielectric plate 56. The microwave is spread in a radial direction in the dielectric plate 56 and emitted into the processing chamber 10 through the slots of the slot antenna 54. Hence, a gas directly below the dielectric plate 52 is ionized, and a plasma is generated in the processing chamber 10.

An antenna rear surface plate 72 is provided on the top surface of the dielectric plate 56. The antenna rear surface plate 72 is made of, e.g., aluminum. A flow path 74 connected to a chiller unit (not shown) is formed in the antenna rear surface plate 72. A coolant or cooling water at a predetermined temperature is circulated through the flow path 74 and pipes 76 and 78. The antenna rear surface plate 72 serves as a cooling jacket that absorbs a heat generated in the dielectric plate 56 and transfers heat to the outside.

In the present embodiment, a gas inlet line 80 is provided so as to penetrate the inner conductor 68 of the coaxial tube 66. A first gas inlet pipe 84 has one end connected to an upper opening 80a of the gas inlet line 80 and the other end connected to a processing gas supply source 82. A gas injection opening 86 is formed at the center portion of the dielectric window 52 and is opened to the processing chamber 10. In a first gas inlet 88 configured as described above, the processing gas from the processing gas supply source 82 flows through the first gas inlet pipe 84 and the gas inlet line 80 in the inner conductor 68, and then is injected from the gas injection opening 86 toward the susceptor 12 disposed therebelow. The injected processing gas is spread outward in a radial direction in the processing chamber 10 because the processing gas is guided toward the exhaust path 18 of the circularly annular shape surrounding the susceptor 12 by the exhaust unit 26. The first gas inlet pipe 84 is provided with a mass flow controller (MFC) 90 and an on-off valve 92.

In the present embodiment, a second processing gas inlet 94 for supplying a processing gas to the processing chamber 10 is provided in addition to the first processing gas inlet 88. The second gas inlet 94 includes a gas ring 91 disposed in the processing chamber 10 and a gas supply line 100 connected to the gas ring 91. The gas ring 91 is formed in a hollow ring shape and has on an inner peripheral side surface thereof a plurality of side injection openings 96 spaced at regular angles in a circumferential direction. The side injection openings 96 are opened in a plasma region in the processing chamber 10. The gas supply line 100 is connected to the gas ring 91 and the processing gas supply source 82. The gas supply line 100 is provided with a mass flow controller (MFC) 102 and an on/off valve 104. The first gas inlet 88 and the second gas inlet 94 form a processing gas introduction unit.

In the second gas inlet 94, the processing gas from the processing gas supply source 82 is introduced to the gas ring 91 via the gas supply line 100. The pressure in the gas ring 91 filled with the processing gas is uniform in the circumferential direction, and thus, the processing gas is uniformly injected in a horizontal direction to the plasma region in the processing chamber 10 from the side injection openings 92. Since the processing gas is supplied from the gas ring 91 to the region where the electron temperature of the plasma is low (plasma diffusion region), a dissociation state of the processing gas can be controlled.

Figure 8:
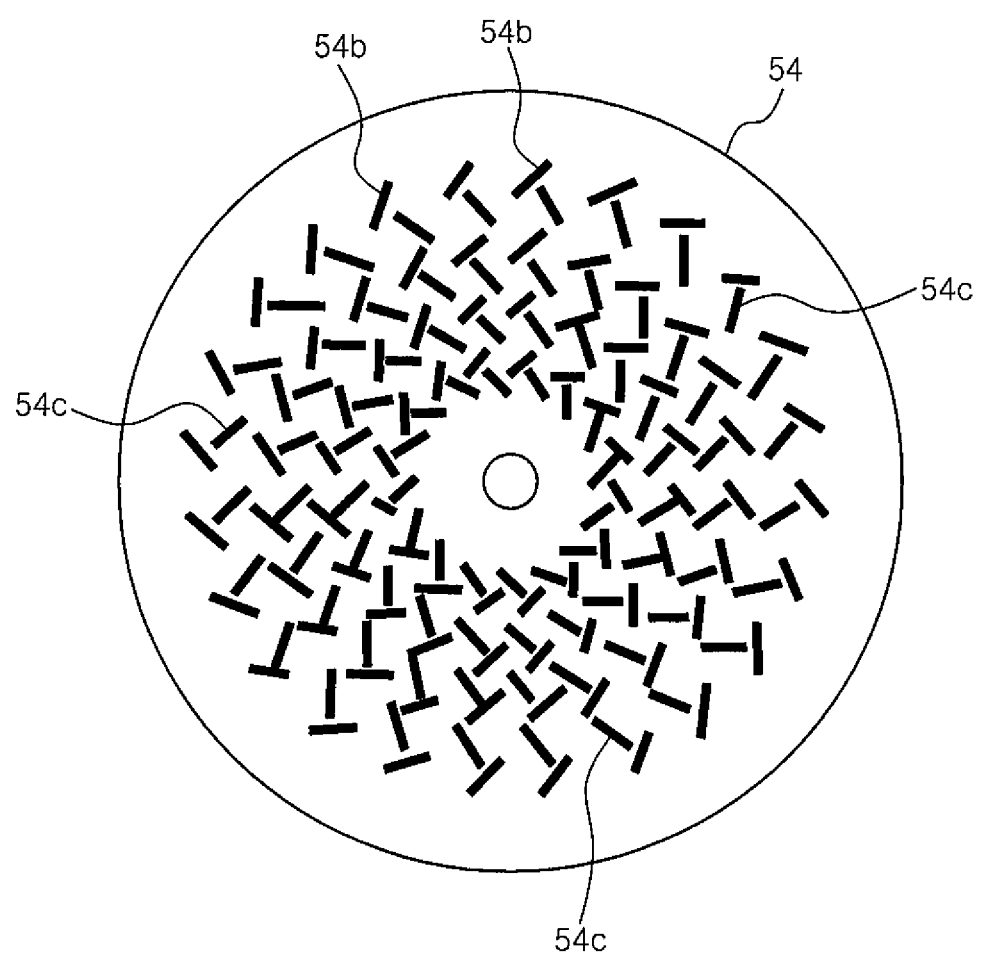
FIG. 8 is a top view showing an example of a slot pattern of a slot antenna.

FIG. 8 shows an example of a slot pattern of the slot antenna 54. The slot antenna 54 includes a plurality of slots 54b and 54c arranged in concentric circles. Specifically, two types of slots whose lengthwise directions are perpendicular to each other are alternately arranged in concentric circles. The distance in the radial direction between the concentric circles is determined based on a wavelength of a microwave propagating in the radial direction of the slot antenna 54. Due to this slot pattern, the microwave is converted to a plane wave having two polarization components intersecting with each other, and the plane wave is radiated from the slot antenna 54. The slot antenna 54 configured as described above is advantageous in that the microwave is uniformly radiated from the entire region of the antenna and suitable to generate a uniform and stable plasma below the antenna.

The individual operation and the overall operation of the exhaust unit 26, the high frequency power supply 30, the DC power supply 40, the switch 42, the microwave generator 60, the processing gas supply source 82, the chiller unit (not shown), the heat transfer gas supply unit (not shown) and the like are controlled by a control unit (not shown). The control unit is formed of, e.g., a microcomputer or the like.

The present invention may be variously changed and modified in consideration of the above-mentioned facts. Specific embodiments may be variously modified or changed without departing from the scope of the present invention.

This application claims priority to Japanese Patent Application No. 2010-147357 filed on Jul. 29, 2010, the entire contents of which are incorporated herein by reference.

What is claimed is:

1. An etching method for etching an insulating film formed on a substrate, comprising:
    first etching of exposing the insulating film to a plasma of a first processing gas to thereby etch the insulating film to a position in a thickness direction, wherein a deposition material is deposited on a surface of the insulating film during the etching, the first processing gas comprising carbon, fluorine, oxygen and hydrogen;
    deposition material removing of exposing, to an oxygen plasma, the deposition material deposited on the insulating film remaining after completion of the first etching to thereby remove the deposition material on the remaining insulating film; and
    second etching of exposing the insulating film remaining after completion of the deposition material removing to a plasma of a second processing gas to thereby etch the remaining insulating film, the second processing gas comprising carbon, fluorine, oxygen and hydrogen.

2. The etching method of claim 1, wherein the insulating film is a silicon oxide film laminated on a silicon nitride film, and the silicon oxide film is etched in the first etching and the second etching.

3. The etching method of claim 2, further comprising silicon nitride film etching of exposing the silicon nitride film to a plasma of a third processing gas to thereby etch the silicon nitride film.

4. The etching method of claim 1, wherein the etching method is for forming a stress-inducing layer for applying stress to at least one of an N channel type FET (Field Effect Transistor) and a P channel type FET formed on the substrate.

5. The etching method of claim 1, wherein the substrate is a silicon substrate having a gate electrode, and the insulating film is a silicon nitride film or a silicon oxide film formed on the silicon substrate, and wherein the etching method is for forming at least one of an offset spacer and a sidewall spacer on a sidewall of the gate electrode.

6. The etching method of claim 1, wherein
    the deposition material removing is carried out in a processing chamber while maintaining a pressure therein at a level not less than about 100 mTorr.

7. The etching method of claim 6, wherein the oxygen plasma is a plasma excited by a microwave;
    the microwave is introduced into a processing space of the processing chamber through a plurality of slots of a slot antenna provided on a top surface of a dielectric window at a ceiling portion of the processing chamber; and a power of the microwave during the deposition material removing is about 3000 W or below.

8. The etching method of claim 1, wherein the first etching, the deposition material removing and the second etching are performed in a same processing chamber.

9. The etching method of claim 1, wherein a processing time of the second etching is shorter than that of the first etching.

10. The etching method of claim 1, wherein a bias voltage is applied to the substrate during the first etching. and the second etching.

11. The etching method of claim 1, wherein the first processing gas and the second processing gas comprise at least one of $CH_2F_2$, $CHF_3$, or $CH_3F$.

12. The etching method of claim 1, wherein the first processing gas and the second processing gas comprise at least one of $O_2$ or CO.

13. The etching method of claim 1, wherein a thickness of the insulating film remaining after the first etching and the deposition material removing is about 10% of an initial thickness of the insulating film.

14. An etching apparatus Comprising:
a processing chamber having at a ceiling portion thereof a dielectric window for transmitting a microwave having a predetermined frequency;
a mounting table provided in the processing chamber for mounting thereon a substrate;
a slot antenna provided on a top surface of the dielectric window of the processing chamber to introduce the microwave into a processing space of the processing chamber through a plurality of slots;
a microwave generator configured to generate the microwave;
a microwave inlet line configured to transmit the microwave generated by the microwave generator to the slot antenna;
a processing gas introducing unit configured to introduce a processing gas supplied from a processing gas supply source into the processing chamber;
an exhaust unit configured to exhaust an inside of the processing chamber through an exhaust port provided at a location lower than a top surface of the mounting table; and
a controller configured to control the etching apparatus to perform an etching method of an insulating film formed on the substrate, the etching method comprising:
first etching of exposing the insulating film to a plasma of a first processing gas to thereby etch the insulating film to a position in a thickness direction, wherein a deposition material is deposited on a surface of the insulating film during the etching, the first processing gas comprising carbon, fluorine, oxygen and hydrogen;
deposition material removing of exposing, to an oxygen plasma, the deposition material deposited on the insulating film remaining after completion of the first etching to thereby remove the deposition material on the remaining insulating film; and
second etching of exposing the insulating film remaining after completion of the deposition material removing to a plasma of a second processing gas to thereby etch the remaining insulating film, the second processing gas comprising carbon, fluorine, oxygen and hydrogen.

15. A method for manufacturing a semiconductor device, comprising:
preparing a substrate comprising a PMOS region and an NMOS region divided by a device isolation region;
forming a silicon nitride film on the substrate to cover the PMOS region and the NMOS region;
forming a silicon oxide film on the silicon nitride film;
first etching of exposing the silicon oxide film to a plasma of a first processing gas to thereby etch the silicon oxide film to a position in a thickness direction, wherein a deposition material is deposited on a surface of the silicon oxide film during the etching, the first processing gas comprising carbon, fluorine, oxygen and hydrogen;
deposition material removing of exposing, to an oxygen plasma, the deposition material deposited on the silicon oxide film remaining after completion of the first etching to thereby remove the deposition material on the remaining silicon oxide film; and
second etching of exposing the silicon oxide film remaining after completion of the deposition material removing to a plasma of a second processing gas to thereby etch the remaining silicon oxide film, the second processing gas comprising carbon, fluorine, oxygen and hydrogen.

* * * * *